(12) United States Patent
Kawazu (10) Patent No.: US 10,014,233 B2
(45) Date of Patent: Jul. 3, 2018

(54) ELECTRONIC COMPONENT CONTAINING PACKAGE AND ELECTRONIC DEVICE

(71) Applicant: KYOCERA Corporation, Kyoto-shi, Kyoto (JP)

(72) Inventor: Yoshiki Kawazu, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 18 days.

(21) Appl. No.: 15/118,905

(22) PCT Filed: Feb. 25, 2015

(86) PCT No.: PCT/JP2015/055355
§ 371 (c)(1),
(2) Date: Aug. 15, 2016

(87) PCT Pub. No.: WO2015/129731
PCT Pub. Date: Sep. 3, 2015

(65) Prior Publication Data
US 2017/0323836 A1   Nov. 9, 2017

(30) Foreign Application Priority Data
Feb. 26, 2014   (JP) ................. 2014-034866

(51) Int. Cl.
*H01L 23/057*   (2006.01)
*H01L 23/04*   (2006.01)
(Continued)

(52) U.S. Cl.
CPC ............ *H01L 23/04* (2013.01); *H01L 23/057* (2013.01); *H01L 23/12* (2013.01); *H05K 1/0219* (2013.01); *H05K 1/117* (2013.01)

(58) Field of Classification Search
USPC ................................. 174/260, 520
See application file for complete search history.

(56) References Cited

U.S. PATENT DOCUMENTS 5,475,565 A * 12/1995 Bhattacharyya ........ H01L 23/04
257/713
6,984,132 B1 * 1/2006 Spalding ................. H01L 23/04
257/E23.181

(Continued)

FOREIGN PATENT DOCUMENTS

JP   11-214903 A   8/1999
JP   2001-319984 A   11/2001
(Continued)

OTHER PUBLICATIONS

International Search Report, PCT/JP2015/055355, dated May 19, 2015, 2 pgs.
(Continued)

*Primary Examiner* — William H Mayo, III
*Assistant Examiner* — Krystal Robinson
(74) *Attorney, Agent, or Firm* — Volpe and Koenig, P.C.

(57) ABSTRACT

An electronic component containing package includes a substrate including a placement region for placing an electronic component in an upper face thereof; a frame disposed on the upper face of the substrate surrounding the placement region, and including a penetration part opening; and an input/output member disposed in the frame closing the penetration part, including a plurality of wiring conductors which extend inward and outward of the frame and are electrically connected to the electronic component. The input/output member includes via conductors which are connected to the wiring conductors and embedded at sites overlapping with the wiring conductors within a region surrounded by the frame in the input/output member, and a ground layer disposed in a surrounding of lower ends of the via conductors being spaced from the via conductors. Improved high frequency characteristics can be achieved.

5 Claims, 12 Drawing Sheets

(51) Int. Cl.
*H05K 1/11* (2006.01)
*H05K 1/02* (2006.01)
*H01L 23/12* (2006.01)

(56) References Cited

U.S. PATENT DOCUMENTS

| | | |
|---|---|---|
| 9,786,572 B1 * | 10/2017 | Beaumier ............... H01L 23/10 |
| 2002/0027231 A1 | 3/2002 | Okada et al. |
| 2005/0104792 A1 | 5/2005 | Asao et al. |
| 2005/0278946 A1 * | 12/2005 | Tanielian ............... H01L 23/04 29/855 |
| 2011/0048796 A1 | 3/2011 | Tsujino |
| 2011/0222252 A1 * | 9/2011 | Chen ..................... H01L 22/32 361/760 |
| 2016/0056091 A1 * | 2/2016 | Kim ..................... H01L 23/552 257/368 |

FOREIGN PATENT DOCUMENTS

| | | |
|---|---|---|
| JP | 2005-150345 A | 6/2005 |
| JP | 2012-151232 A | 8/2012 |
| WO | 2009/096542 A1 | 8/2009 |

OTHER PUBLICATIONS

Extended European Search Report, European Patent Application No. 15754657.3, dated Oct. 4, 2017, 9 pgs.

* cited by examiner

ELECTRONIC COMPONENT CONTAINING PACKAGE AND ELECTRONIC DEVICE

TECHNICAL FIELD

The present invention relates to: an electronic component containing package for containing a high frequency electronic component; and an electronic device.

BACKGROUND ART

As an electronic component containing package (simply referred to as a package, in some cases hereinafter) for containing an electronic component, for example, packages described in Patent Literatures 1 and 2 are known. In the packages described in Patent Literatures 1 and 2, a cut-out part is formed in a metallic frame. An insulating member is fixed to this cut-out part. Then, a plurality of wiring conductors extending inward and outward of the metallic frame are provided in the insulating member. Distal ends of the wiring conductors are provided with terminal attaching electrodes.

By virtue of these wiring conductors and terminal attaching electrodes, for example, a high frequency signal at several GHz is transmitted.

CITATION LIST

Patent Literature

Patent Literature 1: Japanese Unexamined Patent Publication JP-A 2001-319984
Patent Literature 2: Japanese Unexamined Patent Publication JP-A 2005-150345

SUMMARY OF INVENTION

Technical Problem

In recent years, integration enhancement in the above-mentioned electronic devices is in progress. Simultaneously, size reduction of the electronic devices is required and, in accordance with this, size reduction of packages is in progress. When integration enhancement is performed in a package, the number of wiring conductors for connecting the inside and the outside to each other increases. Thus, when the number of wiring conductors increases and yet size reduction is simultaneously desired, the interval between the plurality of wiring conductors provided in parallel to each other need be narrower. Further, the line width of the wiring conductor also need be narrower. This has caused a problem that connection of the wiring conductors to an electronic component becomes difficult. Further, another problem also has been caused that the electrical properties in the connection of the wiring conductors to the electronic component become difficult to be maintained satisfactory.

Further, when a line-shaped electrically conductive member such as a bonding wire is connected to the wiring conductor having a narrow line width, the characteristic impedance in the connection part easily becomes higher than a desired value. This has caused a problem that impedance matching becomes difficult to be achieved.

The invention has been devised in view of the above-mentioned problems. An object thereof is to provide: an electronic component containing package for high frequency application in which integration enhancement and size reduction can be achieved; and an electronic device employing the same.

Solution to Problem

An electronic component containing package according to an embodiment of the invention includes: a substrate including a placement region for placing an electronic component in an upper face thereof; a frame disposed on the upper face of the substrate surrounding the placement region, and including a penetration part opened inward and outward; and an input/output member disposed in the frame closing the penetration part, including a plurality of wiring conductors which extend inward and outward of the frame and are electrically connected to the electronic component, and including via conductors which are connected to the wiring conductors and embedded at sites overlapping with the wiring conductors within a region surrounded by the frame in the input/output member, and a ground layer disposed in a surrounding of lower ends of the via conductors being spaced from the via conductors.

An electronic device according to an embodiment of the invention includes: the electronic component containing package; an electronic component which is placed on the placement region of the electronic component containing package and is electrically connected through bonding wires to the wiring conductors; and a lid connected to an upper face of the frame and sealing the electronic component.

Advantageous Effects of Invention

According to the invention, it is possible to provide an electronic component containing package in which integration enhancement and size reduction can be achieved and which has excellent high frequency characteristics, and an electronic device employing the same.

DESCRIPTION OF EMBODIMENTS

An electronic component containing package 1 and an electronic device 10 according to an embodiment of the invention are described below with reference to the drawings.

<Configuration of Electronic Device>

Figure 1:
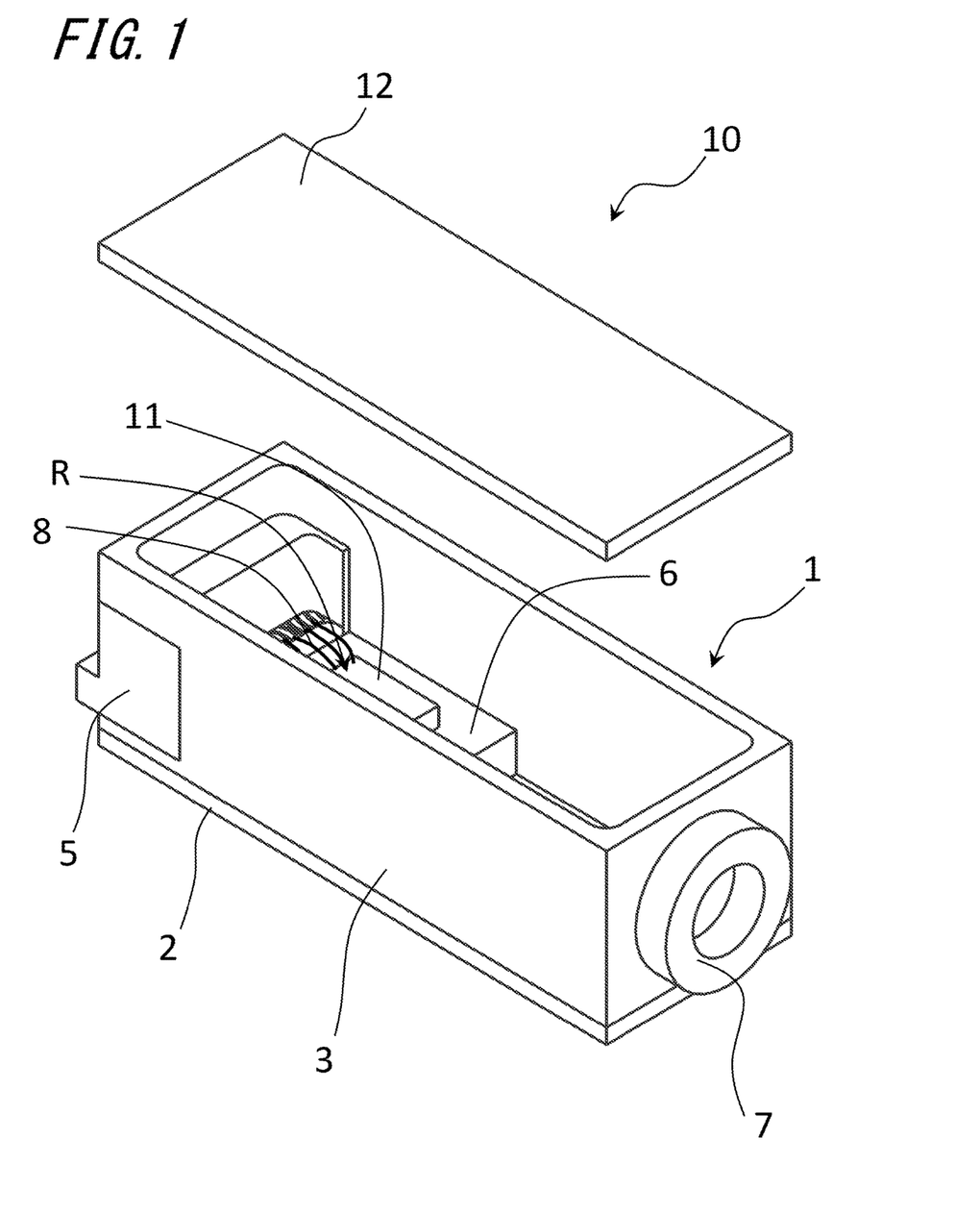
FIG. 1 is an exploded perspective view showing an electronic device according to an embodiment of the invention in a state where a lid has been detached.

FIG. 1 is an exploded perspective view showing an electronic device 10 according to an embodiment of the invention. As shown in FIGS. 1 to 4, an electronic component containing package 1 according to an embodiment of the invention includes: a substrate 2 including a placement region R for placing an electronic component 11 in an upper face thereof; a frame 3 disposed on the upper face of the substrate 2 surrounding the placement region R; and an input/output member 5 fixed to the frame 3. The frame 3 includes a penetration part H opened inward and outward along the upper face. The input/output member 5 is disposed closing the penetration part H. Further, the input/output member 5 includes a plurality of wiring conductors 4 which extend inward and outward of the frame 3 and are electrically connected to the electronic component 11.

The substrate 2 is a member for hermetically sealing the electronic component 11 in cooperation with the frame 3, the input/output member 5, and a lid 12. Further, the substrate 2 serves also as a member for transmitting to the outside the heat generated by the electronic component 11 so that heat radiation is achieved.

For example, the substrate 2 is a plate-shaped member having a quadrangular shape in a plan view. In the embodiment, a mounting board 6 is installed in the placement region R of the substrate 2. For example, a wiring pattern is disposed on the upper face of the mounting board 6. Then, the electronic component 11 is placed on and electrically connected to the wiring pattern. In this case, the placement region R indicates a region of the substrate 2 overlapping with the mounting board 6 in a plan view of the substrate 2.

The substrate 2 may be formed of a metallic material such as iron, copper, nickel, chromium, cobalt, and tungsten or, alternatively, an alloy or a composite material composed of these metals. When a metalworking method such as a rolling process method and a punching method is applied on an ingot of such a metallic material, the substrate 2 can be manufactured.

The mounting board 6 is formed of an insulating material. For example, the material constituting the mounting board 6 may be a ceramic material such as an aluminum-oxide based sintered compact, a mullite-based sintered compact, a silicon-carbide based sintered compact, an aluminum-nitride based sintered compact, or a silicon-nitride based sintered compact.

The frame 3 is disposed on the upper face of the substrate 2 so as to form a wall surface surrounding the placement region R. In the embodiment, the frame 3 has a frame-like shape whose inner periphery and outer periphery are each substantially quadrangular in a plan view. The frame 3 has a penetration part H which is disposed along the upper face of the substrate 2 and is provided with an aperture opened inward and outward. The input/output member 5 is fixed to the penetration part H. The frame 3 holds the input/output member 5.

Figure 2:
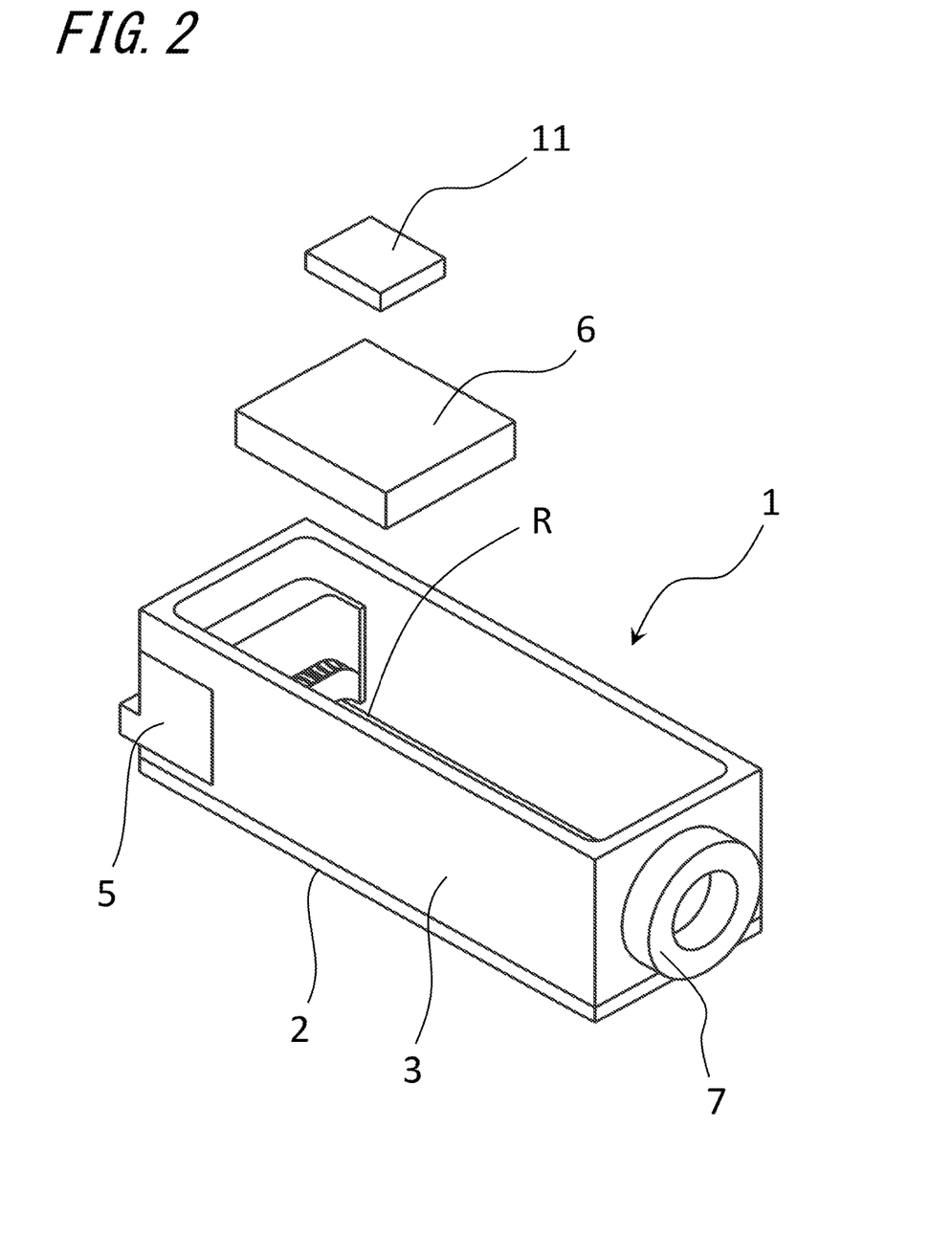
FIG. 2 is an exploded perspective view showing the electronic device shown in FIG. 1 in a state where a lid has been removed.
Figure 3:
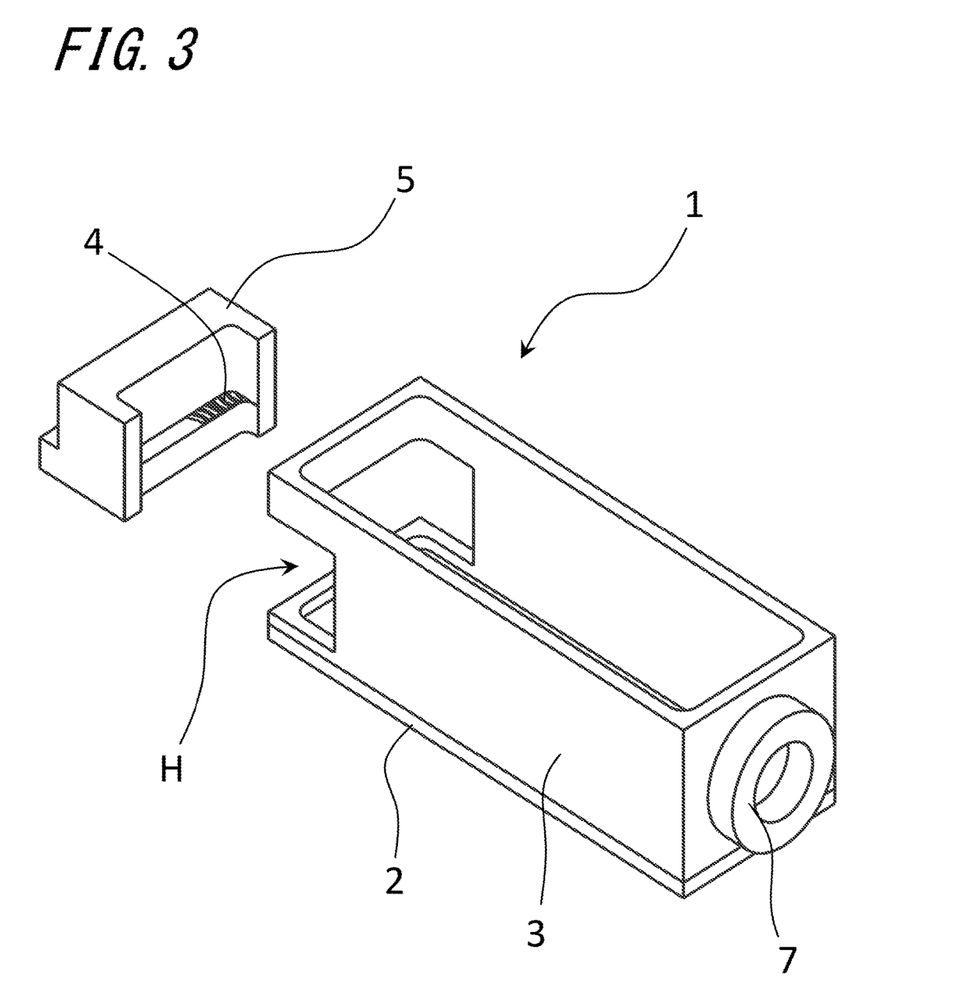
FIG. 3 is an exploded perspective view of an electronic component containing package according to an embodiment of the invention.
Figure 4:
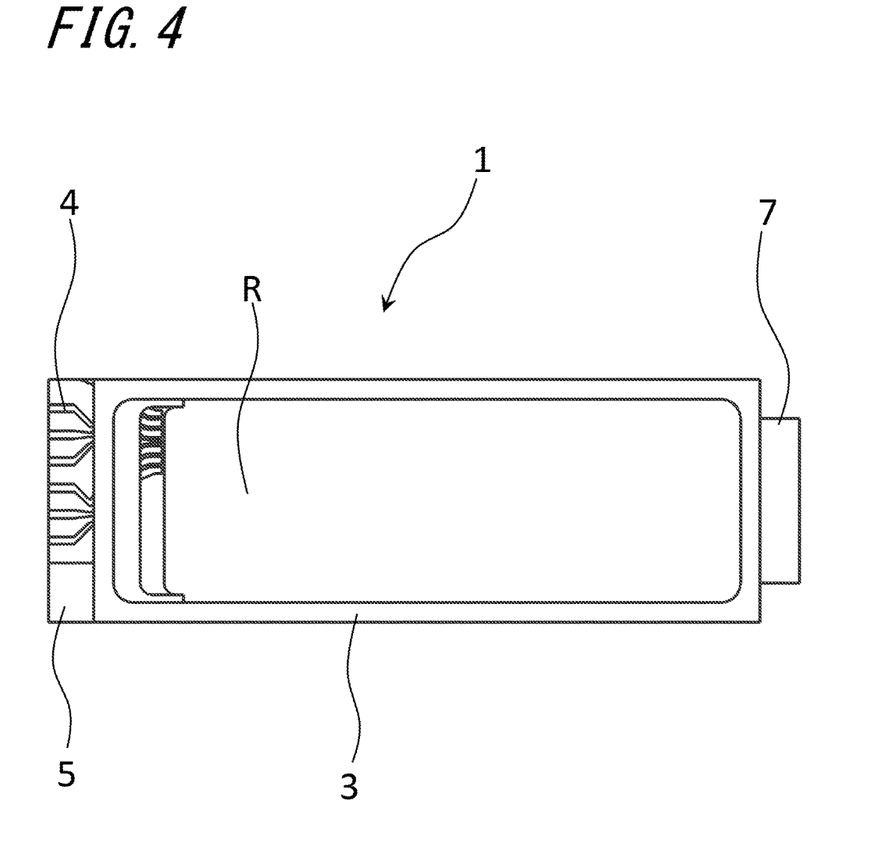
FIG. 4 is a plan view of the electronic component containing package.

As shown in FIGS. 1, 2, and 3, the penetration part H of the frame 3 is provided so as to pass through the inside and the outside of the frame 3. The penetration part H may be provided by cutting off the lower face or the upper face of the frame 3. In this case, the penetration part H is formed between the frame 3 and the substrate 2 or the frame 3 and the lid 12 assembled together.

The frame 3 may be formed of a metallic material such as iron, copper, nickel, chromium, cobalt, and tungsten or, alternatively, an alloy composed of these metals. When a metalworking method such as a rolling process method and a punching method is applied on an ingot of such a metallic material, the frame 3 can be manufactured.

In the embodiment, the frame 3 is provided with an opening part in a part of the frame opposite to the penetration part H. Then, an optical member 7 is fixed to the opening part via a jointing material such as a brazing material. The optical member 7 is a cylindrical member. The optical member 7 is provided for fixing an optical fiber to the package 1. The optical fiber is fixed to the optical member 7 via an optical fiber fixing member. When the optical fiber fixing member is fixed to the optical member 7, the package 1 serves as an optical element containing package 1 capable of signal exchange between the optical fiber and the electronic component 11.

The optical member 7 may be formed of a metallic material such as iron, copper, nickel, chromium, cobalt, and tungsten or, alternatively, an alloy composed of these metals. When a metalworking method such as a rolling process method and a punching method is applied on an ingot of such a metallic material, the optical member 7 can be manufactured.

It is preferable that the frame 3 and the optical member 7 are formed of the same metallic material. By virtue of this, the thermal expansion difference between the frame 3 and the optical member 7 can be reduced. As a result, a stress generated between the frame 3 and the optical member 7 under heat cycles can be reduced.

The input/output member 5 is a member for electrically connecting to the external circuit the electronic component 11 or the wiring pattern disposed on the mounting board 6. In the input/output member 5, a metallized layer is formed in a site joined to the penetration part H, and this metallized layer is fixed to the penetration part H via a jointing material such as a brazing material. The input/output member 5 is fixed so as to close the penetration part H. In the input/output member 5, one end portion is located on the inside of the frame 3 and the other end portion is located on the outside of the frame 3.

The input/output member 5 includes the plurality of wiring conductors 4. The plurality of wiring conductors 4 are arranged so as to extend inward and outward of the frame 3, and are electrically connected through line-shaped electrically conductive members such as bonding wires 8 to the electronic component 11 or the wiring pattern disposed on the mounting board 6. Here, the wiring conductors 4 are composed of signal lines through which high frequency signals propagates and ground conductors serving as reference potentials.

In the input/output member 5, within a region surrounded by the frame 3, a via conductor 51 is connected to each of the plurality of wiring conductors 4 at a position on the second insulating member 54 side relative to a position where the bonding wire 8 is connected in the end portion of the wiring conductor 4. The end portions of the wiring conductors 4 are located within a region surrounded by the frame 3. The end portions of the wiring conductors 4 are electrically connected through line-shaped electrically conductive members such as the bonding wires 8 to the electronic component 11 or the wiring pattern disposed on the mounting board 6. The expression "the second insulating member 54 side" indicates a side opposite to a distal end of the wiring conductor 4 on the inside of the frame 3, that is, a direction toward the outside end portion of the frame 3. By virtue of this, the bonding wires 8 can stably be connected to the wiring conductors 4 without an influence of the flatness of the upper faces of the via conductors 51.

At the lower ends of the plurality of via conductors 51, a ground layer 52 is disposed surrounding a surrounding of the via conductors 51 and being spaced from the plurality of via conductors 51.

The ground layer 52 is arranged so as to overlap with the wiring conductors 4 connected to the via conductors 51 in a plan view. The ground layer 52 serves as a ground conductor of a microstrip line or a coplanar line with ground in which each wiring conductor 4 for transmitting a high frequency signal is employed as a signal line.

The input/output member 5 has a structure in which a plurality of insulating members are laminated together. The input/output member 5 includes, as a part of the plurality of insulating members, a first insulating member 53 having a board shape and a second insulating member 54 disposed on the first insulating member 53.

A metallized pattern serving as the wiring conductors 4 is formed between the first insulating members 53 and the second insulating member 54. Further, a metallized pattern serving as the ground layer 52 is formed in an inner layer of the first insulating member 53. Here, these metallized patterns may be provided so as to be laminated between the plurality of insulating members. For example, the first insulating member 53 may be a laminate of a plurality of insulating members, and the ground layer 52 may be formed as a metallized pattern laminated between these insulating members.

Figure 5:
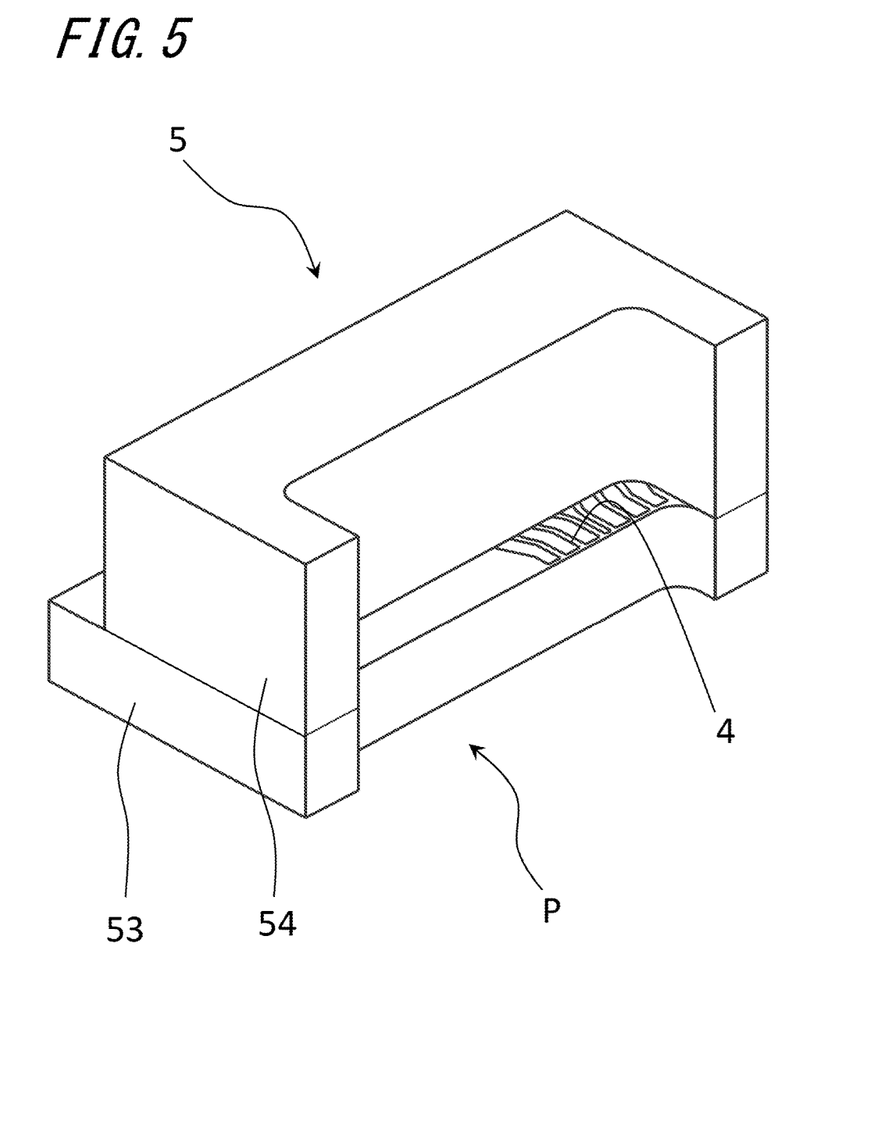
FIG. 5 is an external appearance perspective view of an input/output member of the electronic component containing package.
Figure 6:
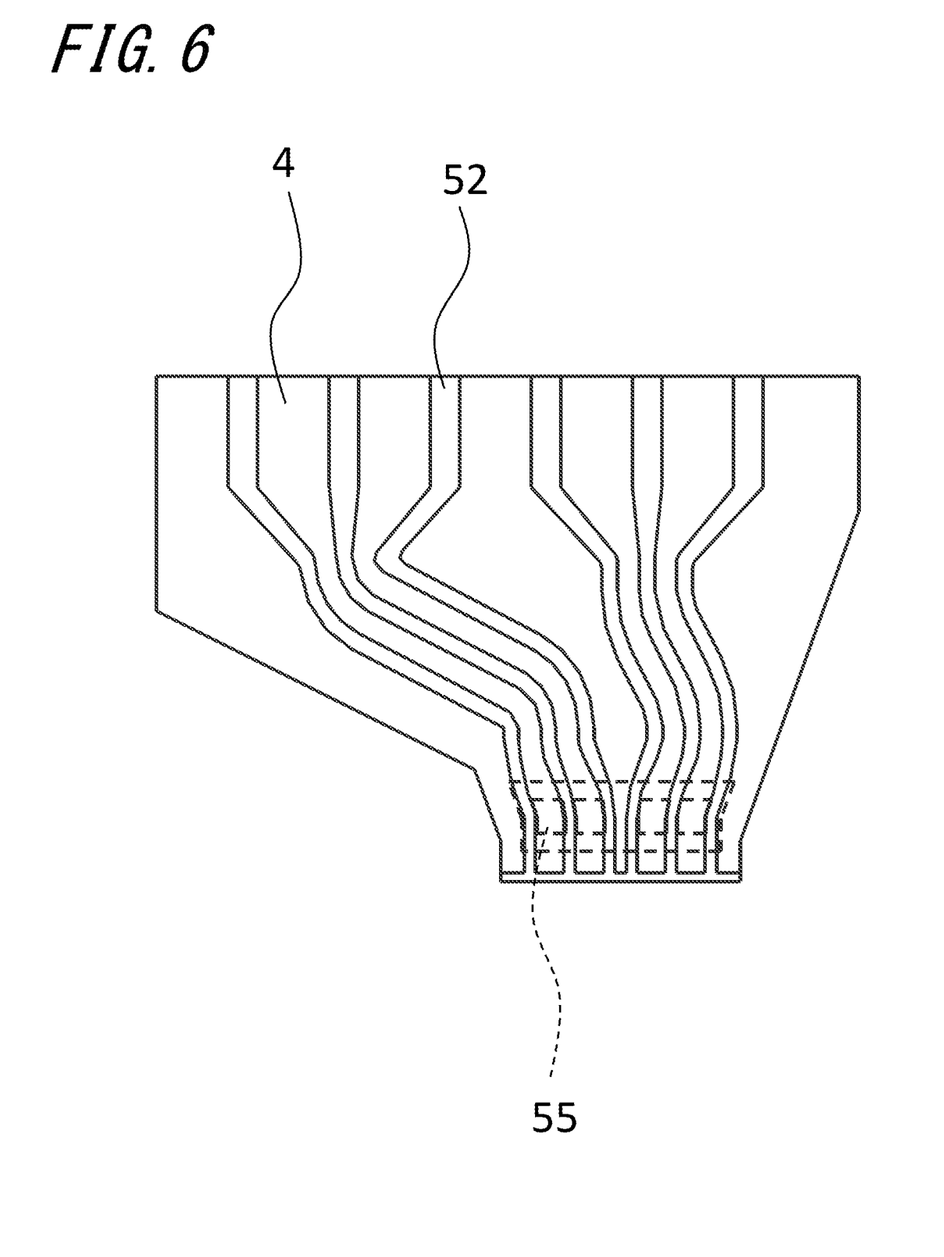
FIG. 6 is a plan view of a wiring pattern disposed in the input/output member.

The first insulating member 53 is a plate-shaped member and has a plan view shape obtained by cutting out one side from a substantial quadrangle. The end portions of the first insulating member 53 are arranged on the inside and the outside of the frame 3. As shown in FIG. 5, in the embodiment, the input/output member 5 includes a recess P located on the placement region R side, that is, on a side close to an inside end portion of the frame 3.

Then, the electronic component 11 and the mounting board 6 are installed so as to be contained on the inside of the recess P. Since the electronic component 11 and the mounting board 6 are arranged so as to be surrounded on the inside of the recess P, a larger number of the wiring conductors 4 connected to the electronic component 11 can be arranged. By virtue of this, the connection distance through the bonding wires 8 can be reduced. Thus, high frequency characteristics of the electronic device 10 can be stabilized. Further, size reduction can be achieved in the electronic device 10.

The second insulating member 54 is disposed on the first insulating member 53 in a state where a part of the upper face of the first insulating member 53 and the end portions of the wiring conductors 4 are exposed. The exposed portions of the first insulating member 53 are an end portion where the recess P is provided, and an end portion opposite thereto.

The first insulating member 53 and the second insulating member 54 are formed of a material having a satisfactory insulating property. For example, the material constituting the first insulating member 53 may be a ceramic material such as an aluminum-oxide based sintered compact, a mullite-based sintered compact, a silicon-carbide based sintered compact, an aluminum-nitride based sintered compact, or a silicon-nitride based sintered compact. Here, the first insulating member 53, the second insulating member 54, and the wiring conductors 4 are formed integrally with each other by applying a paste containing a high melting-point metal material in a desired pattern of the wiring conductors 4 onto a green sheet containing particles composed of the above-mentioned ceramic material and then laminating these green sheets together and co-firing the laminate.

Figure 7:
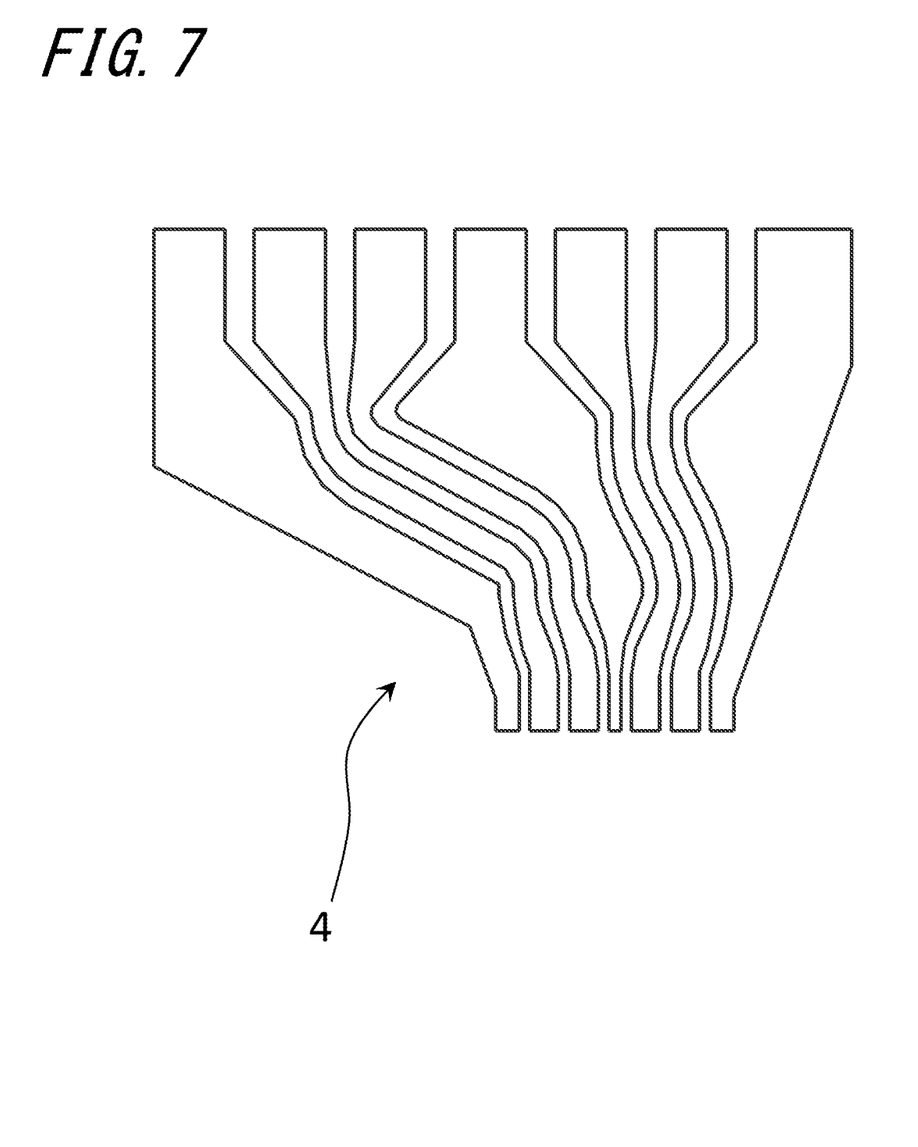
FIG. 7 is a plan view showing wiring conductors within the wiring pattern disposed in the input/output member.

The wiring conductors 4 are disposed on the upper face of the first insulating member 53. The wiring conductors 4 are electrically connected through the bonding wires 8 to the electronic component 11 or the conductors disposed on the mounting board 6. In the embodiment, as shown in FIG. 7, the wiring conductors 4 are composed of seven lines. That is, the wiring conductors 4 are composed of a ground line, a signal line, a signal line, a ground line, a signal line, a signal line, and a ground line in this order from one side to the other side. Adjacent signal lines are used as a differential signal line.

For example, the wiring conductors 4 are formed of a high melting-point metal material such as tungsten, molybdenum, and manganese. Here, in the embodiment, seven lines have been employed. However, employable configurations are not limited to this. For example, the wiring conductors 4 may be nine lines consisting of, a ground line, a signal line, a ground line, a signal line, a ground line, a signal line, a ground line, a signal line, and a ground line in this order from one side to the other side. Further, all lines may be of signal line like in a microstrip line. Further, a differential signal line in which signal lines are adjacent to each other may be not employed.

As such, when the wiring conductors 4 are composed of signal lines and ground lines, the via conductor 51 is disposed in the end portion of each signal line and the end portion of each ground line is not provided with the via conductor 51.

The wiring conductor 4 is formed so that the line width of the end portion located on the outside of the frame 3 is wider than the line width of the end portion located on the inside of the frame 3. When the line width on the outside of the frame 3 is set to be wide, a lead terminal can easily be connected onto the wiring conductor 4 located on the outside of the frame 3. On the other hand, when the line width of the end portion of the wiring conductor 4 located on the inside of the frame 3 is set to be narrow, the arrangement region for the wiring conductors 4 on the inside of the frame 3 can be made smaller. Then, one end of a line-shaped electrically conductive member such as the bonding wire 8 is connected onto the end portion of each wiring conductor 4 located on the inside of the frame 3.

Figure 8:
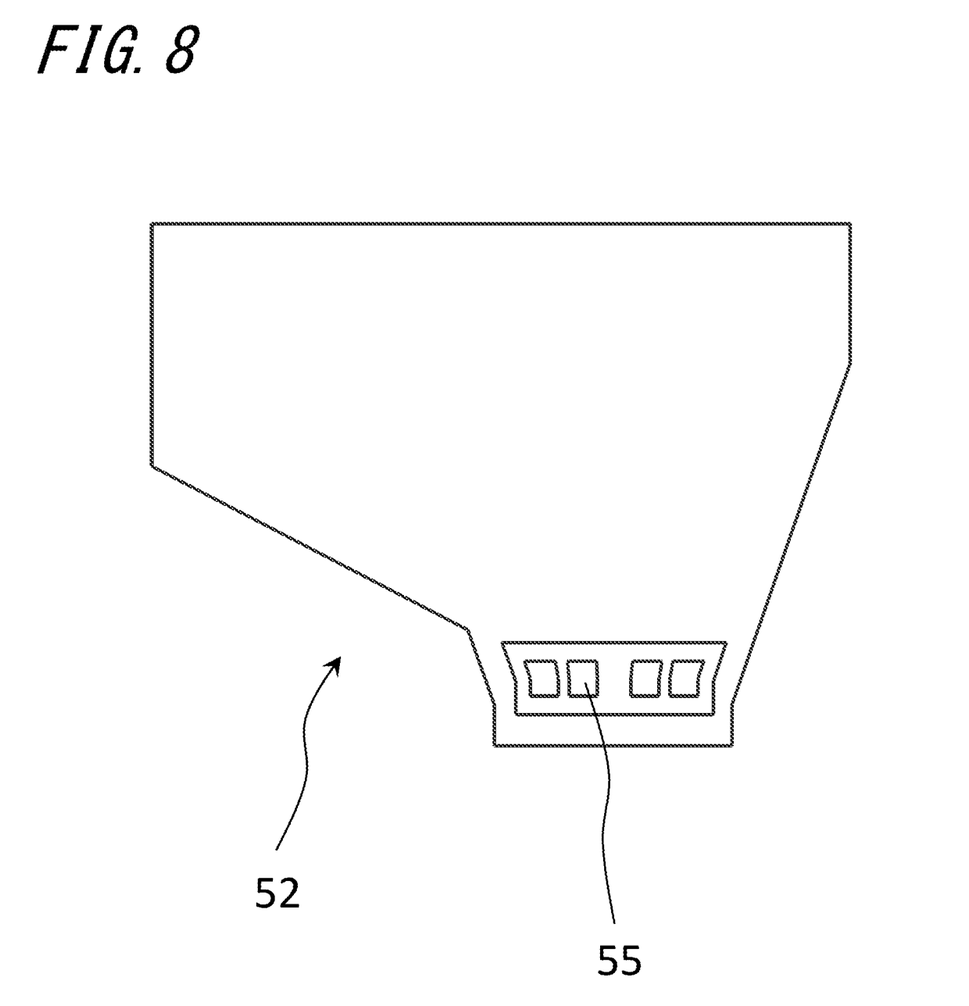
FIG. 8 is a plan view showing a ground layer within the wiring pattern disposed in the input/output member.
Figure 9:
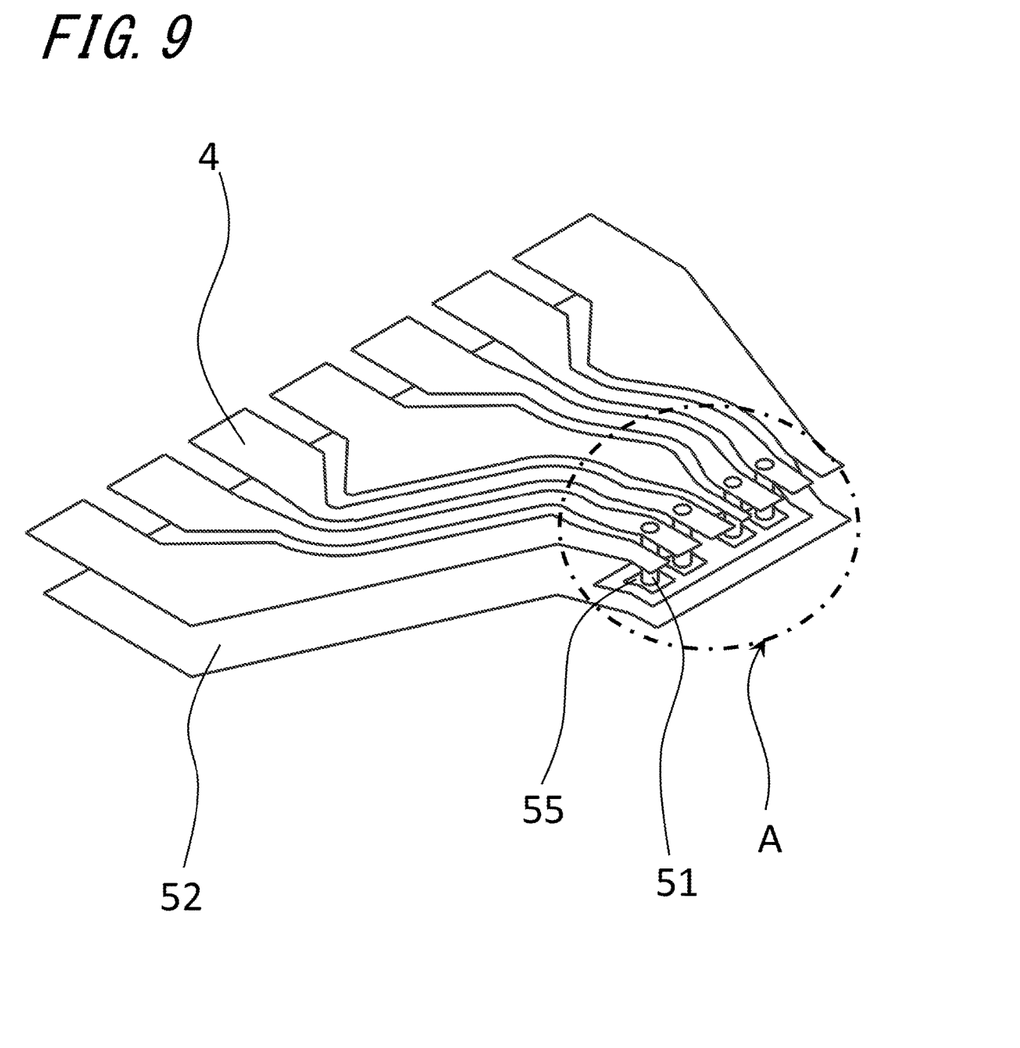
FIG. 9 is an external appearance perspective view of the wiring pattern disposed in the input/output member.
Figure 10:
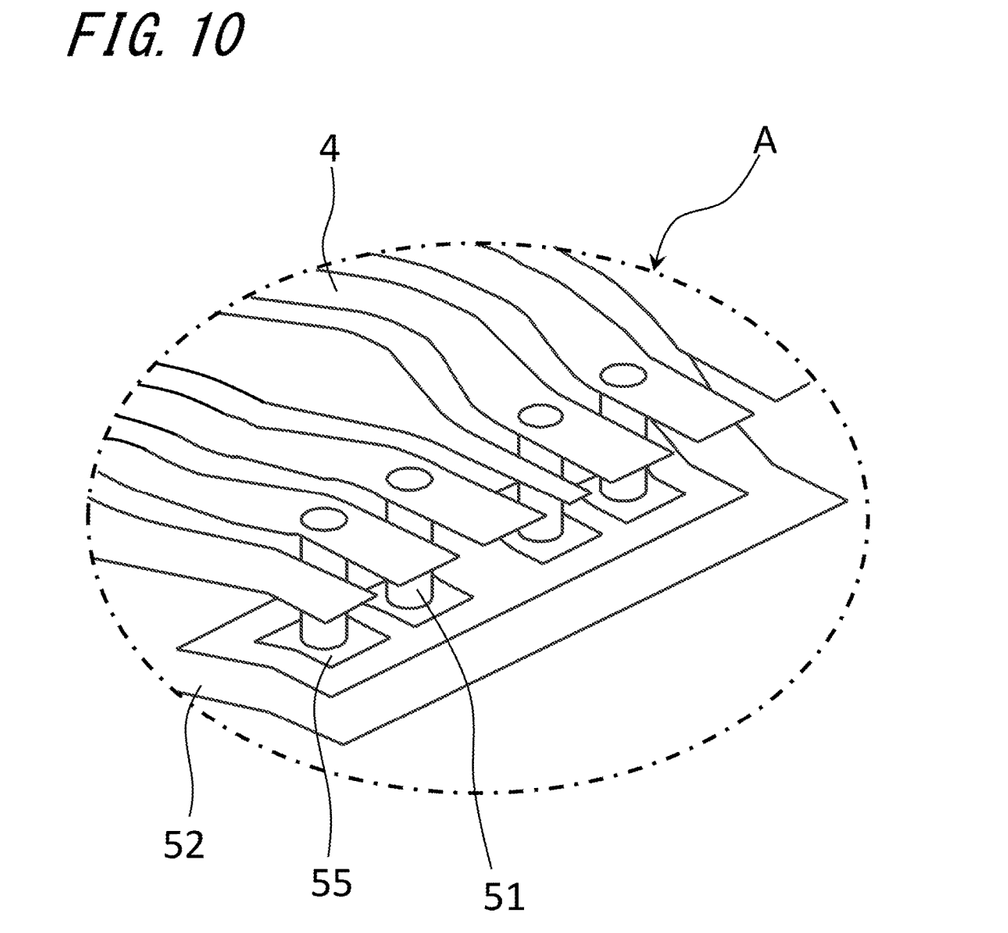
FIG. 10 is an enlarged external appearance perspective view showing a part A of FIG. 10.
Figure 11:
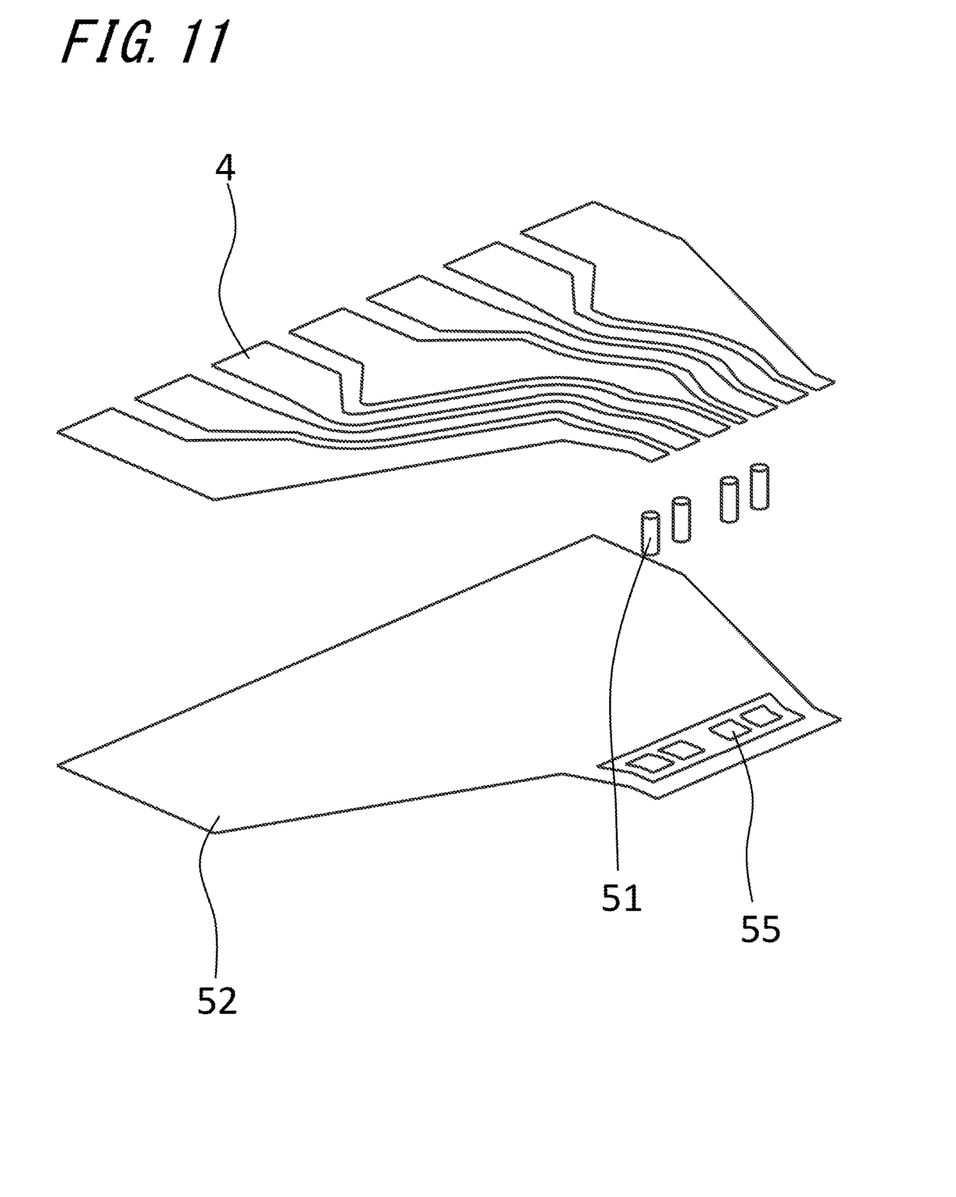
FIG. 11 is an exploded perspective view of the wiring pattern shown in FIG. 9.

FIGS. 8 and 9 show the shape of the ground layer 52 arranged under the wiring conductors 4. The ground layer 52 is formed in the surrounding of the lower ends of the via conductors 51 connected to the wiring conductors 4, so as to be spaced from the via conductors 51. That is, the via conductors 51 and the ground layer 52 are not connected to each other.

Capacitive coupling is generated between the via conductor 51 and the ground layer 52 or the ground line. Then, since the via conductor 51 is connected to the wiring conductor 4, the capacitance component is increased in a portion of the wiring conductor 4 where the via conductor 51 is connected.

The portion of the line-shaped electrically conductive member such as the bonding wire has a weak coupling with the ground potential layer and hence has a tendency that the inductance component becomes large. In this case, a large change in characteristic impedance is caused in the joining part with the wiring conductor 4. Thus, the via conductor 51 is disposed in the vicinity of the connection part with the wiring conductor 4 so that the capacitance component is increased and thereby the change in characteristic impedance can be alleviated.

Here, as shown in FIGS. 8 and 9, a plurality of metal layers 55 connected to the via conductors 51 may be disposed in the portion in contact with the lower end of each of the plurality of via conductors 51 within a region surrounded by the ground layer 52. The plurality of metal layers 55 are connected through the via conductors 51 to the signal lines among the wiring conductors 4. The plurality of metal layers 55 are arranged immediately under the via conductors 51. Thus, the metal layer 55 located on the second insulating member 54 side relative to the end portion of the wiring conductor 4 located in the portion surrounded by the frame 3 or relative to the position where the line-shaped electrically conductive member such as the bonding wire 8 is connected. For example, the metal layers 55 are formed of a high melting-point metal material such as tungsten, molybdenum, and manganese.

The metal layer 55 generates capacitive coupling with the ground layer 52 in the surrounding. Since the metal layer 55 is connected through the via conductor 51 to the wiring conductor 4, the capacitance component is further increased in a portion of the wiring conductor 4 where the via conductor 51 is connected. Thus, the via conductor 51 and the metal layer 55 can further increase the capacitance component in the wiring conductor 4 serving as a signal line for transmitting a high frequency signal and thereby can further alleviate the change in characteristic impedance in a portion where the wiring conductor 4 is connected.

That is, the metal layer 55 can further reduce the mismatching in characteristic impedance in the connection part between the wiring conductor 4 for transmitting a high frequency signal and the bonding wire 8. That is, in place of an approach that the line width of the signal line is increased so that the capacitance component is increased, the metal layer 55 is provided so that the capacitance component in the signal line can be increased.

As a result, without the necessity of size increase in the input/output member 5 for the purpose of increasing the line widths of the signal lines, it is possible to manufacture the electronic component containing package 1 having excellent frequency characteristics. That is, it is possible to provide an electronic component containing package in which integration enhancement and size reduction can be achieved and an electronic device employing the same.

The electronic component 11 is placed on the placement region R of the substrate 2 via the mounting board 6. In this case, the electronic component 11 is electrically connected through the bonding wires 8 and the wiring pattern disposed on the mounting board 6 to the wiring conductors 4 of the input/output member 5. For example, the employed electronic component 11 may be a high frequency electronic component such as an optical semiconductor element, an IC element, and a capacitor. In the electronic device 10 of the embodiment, an example is employed that an optical semiconductor element is adopted as the electronic component 11. Examples of the optical semiconductor element include a light emitting element represented by an LD (Laser Diode) element and a light receiving element represented by a PD (Photodiode) element.

The lid 12 is a member for hermetically sealing the electronic component 11 in cooperation with the substrate 2, the input/output member 5, and the frame 3. The lid 12 is connected to the upper face of the frame 3. Then, a space surrounded by the substrate 2, the frame 3, the input/output member 5, and the lid 12 seals the electronic component 11 hermetically. When the electronic component 11 is sealed as described here, degradation of the electronic component 11 can be suppressed over a long term.

For example, the lid 12 may be formed of a metal member such as iron, copper, nickel, chromium, cobalt, and tungsten or, alternatively, an alloy or a composite member composed of these metals. For example, the frame 3 and the lid 12 are joined together via a brazing material or the like.

The electronic device 10 according to an embodiment of the invention includes the electronic component containing package 1, the electronic component 11, and the lid 12. Specifically, the electronic device 10 includes: the electronic component containing package 1; the electronic component 11 placed on the placement region R of the electronic component containing package 1 and electrically connected through the bonding wires 8 (and the wiring pattern disposed on the mounting board 6) to the wiring conductors 4; and the lid 12 joined to the upper face of the frame 3 so as to close the inside of the frame 3.

In the electronic component containing package 1 according to the embodiment, the plurality of via conductors 51 respectively and separately connected to the plurality of wiring conductors 4 are embedded at sites overlapping with the plurality of wiring conductors 4 within a region surrounded by the frame 3 in the input/output member 5. Further, the ground layer 52 is disposed in the surrounding of the lower ends of the plurality of via conductors 51, so as to be spaced from the plurality of via conductors 51. By virtue of this, the capacitance components in the plurality of wiring conductors 4 can be increased. As a result, in comparison with a structure that each wiring conductor 4 is not connected to each via conductor 51, even when the bonding wire 8 is connected, the mismatching in characteristic impedance between the electronic component 11 and the input/output member 5 can be reduced.

Further, in the electronic component containing package 1 according to the embodiment, the plurality of metal layers 55 respectively and separately connected to the plurality of via conductors 51 are disposed within the region surrounded by the ground layer 52 so that the capacitance components in the plurality of wiring conductors 4 can further be increased. Thus, the line width of the wiring conductor 4 may be not increased and the interval between the wiring conductor 4 and the ground layer 52 may be not increased and, yet, the controllable range of the capacitance component in the wiring conductor 4 can be increased.

Further, in the plurality of wiring conductors 4, the distance between the plurality of wiring conductors 4 is set to be shorter within the region surrounded by the frame 3 than in the outside of the region surrounded by the frame 3 so that signal lines of narrow pitch can be formed. This contributes to the size reduction of the input/output member 5.

EXAMPLES

As a specific example of the invention, one typical example of the electronic component containing package 1 shown in FIGS. 1 to 11 is described below.

The electronic component containing package 1 is a metal container formed in a substantially rectangular parallelepiped shape having a width of 6 mm, a length of 16 mm, and a height of 5 mm in outer dimensions. The substrate 2 is a metal plate formed of a copper-tungsten composite material and having a width of 6 mm, a length of 16 mm, and a thickness of 0.5 mm. The frame 3 is a metal plate formed in a frame shape having a width of 6 mm and a length of 16 mm and formed of an iron-nickel-cobalt alloy having a thickness of 0.5 mm. The lid 12 is a metal plate formed of an iron-nickel-cobalt alloy and having a width of 6 mm, a length of 16 mm, and a thickness of 0.25 mm.

In the input/output terminal 5, the first insulating member 53 has a width of 6 mm, a length of 3 mm, and a thickness of 1 mm and the second insulating member 54 has a width of 6 mm, a length of 2.2 mm, and a thickness of 2.3 mm. The first insulating member 53 and the second insulating member 54 are formed of an aluminum-oxide based sintered compact. Each of the first insulating member 53 and the second insulating member 54 are an insulating member provided with the recess P and having a U-shape in a plan view.

The input/output terminal 5 has such a shape that the second insulating member 54 is laminated on the first insulating member 53 except for the outside end portion of the frame 3 and a part of the inside end portion of the frame 3 in the first insulating member 53.

The wiring conductors 4 shown in FIG. 7 are formed on the upper face of the first insulating member 53. The wiring conductors 4 are formed of metallized conductors obtained by firing a tungsten material.

On the outside of the frame 3, the width of the wiring conductor 4 to which the lead terminal is joined is 0.5 mm. In the shape of the wiring conductor 4, the same line width is maintained over a distance of 0.8 mm toward the outside wall surface of the second insulating member 54, and the line width is gradually reduced over a distance of 0.5 mm from that point. Then, the wiring conductor 4 extends to the inside (the inside of the frame 3) end portion of the second insulating member 54.

As described above, the wiring conductors 4 shown in FIG. 7 are based on an example of two differential signal lines each constructed such that a signal line and a ground line are combined together. Here, the interval between the signal line and the ground line is set to be 0.2 mm in the outside part of the frame 3 where the lead terminals are joined and 0.1 mm in a portion where the line width is narrow on the inside of the frame 3. Further, the interval between adjacent signal lines is set to be 0.2 mm in the outside part of the frame 3 where the lead terminals are joined and 0.1 mm in a portion where the line width is narrow on the inside of the frame 3.

Then, the via conductor 51 is connected at a position of 0.3 mm from the terminal end of the signal line of the wiring conductor 4 on the inside of the frame 3. For example, the via conductor 51 has a thickness of 0.1 mm and a length of 0.15 mm.

The ground layer 52 and the metal layers 55 shown in FIG. 8 or 9 are formed in the layer at 0.15 mm under the wiring conductors 4. Similarly to the wiring conductors 4, the ground layer 52 and the metal layers 55 are constructed from metallized conductors formed of tungsten.

The metal layer 55 is formed in a substantially quadrangular shape having a width of 0.2 mm and a length of 0.5 mm. In the surrounding of 0.15 mm around the metal layers 55, a non-formed region is provided where the ground layer 52 is not formed.

Figure 12:
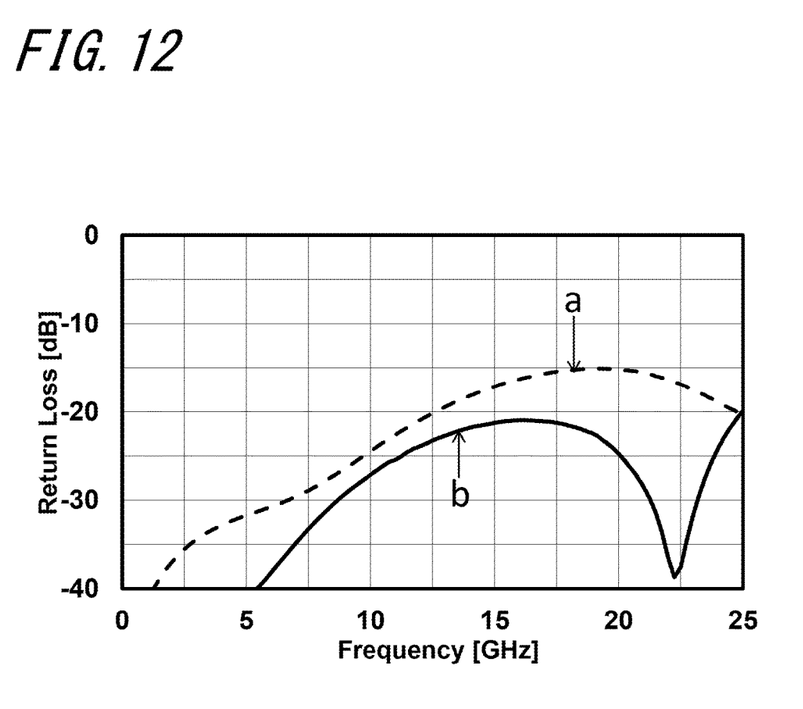
FIG. 12 is a diagram showing high frequency reflection characteristics of the electronic component containing package according to an embodiment of the invention and an electronic component containing package of the conventional art.

FIG. 12 is a diagram showing the results of simulations for the high frequency reflection loss in an electronic device based on the specific example of the electronic component containing package 1 given above and in an electronic device in which the via conductors 51 and the metal layers 55 have been removed from the electronic component containing package 1. In the electronic device in which the via conductors 51 and the metal layers 55 have been removed, the ground layer 52 is formed as a so-called solid pattern conductor in which the non-formed region is not provided under the end portions of the wiring conductors 4.

In FIG. 12, line "a" indicates the reflection characteristics in the electronic component containing package of a comparative example in which the via conductors 51 and the metal layers 55 have been removed from the electronic component containing package 1 of the example.

Line "b" indicates the reflection characteristics in a case that the via conductors 51, the metal layers 55, and the ground layer 52 shown in the above-mentioned example are provided in the electronic component containing package of the comparative example.

As seen from the comparison between these lines "a" and "b", in the electronic component containing package 1 of the example in which the via conductors 51, the metal layers 55, and the ground layer 52 are provided, the reflection loss is alleviated in comparison with the electronic component containing package of the comparative example.

Here, the invention is not limited to the above-mentioned embodiment and various changes, improvements, and the like are possible without departing from the scope of the invention.

For example, an embodiment has been given above for a case where the entire surrounding of the lower ends of the via conductors 51 is surrounded by the ground layer 52. However, the surrounding of the lower ends of the via conductors 51 are not necessarily surrounded entirely. That is, the ground layer 52 may be provided only in part of the surrounding of the lower ends of the via conductors 51. For example, the ground layer 52 on the inner end-face side of the frame 3 may be not formed and hence only a half of the surrounding may be surrounded.

Further, similarly to the above-mentioned case, for example, a surrounding of the metal layers 55 is not necessarily surrounded entirely by the ground layer 52. It is sufficient that the ground layer 52 is provided only in part of the surrounding of the metal layers 55. That is, the ground layer 52 on the inner end-face side of the frame 3 may be not formed and hence only a half of the surrounding may be surrounded.

Further, the metal layer 55 may be disposed at a position overlapping with the connection part where the bonding wire 8 is connected in a plan view of the electronic component containing package 1.

REFERENCE SIGNS LIST

1: Electronic component containing package
2: Substrate
3: Frame
4: Wiring conductor
5: Input/output member
51: Via conductor
52: Ground layer
53: First insulating member
54: Second insulating member
55: Metal layer
6: Mounting board
7: Optical member
8: Bonding wire 10: Electronic device
11: Electronic component
12: Lid
R: Placement region
H: Penetration part
P: Recess

The invention claimed is:

1. An electronic component containing package, comprising:
- a substrate comprising a placement region for placing an electronic component in an upper face thereof;
- a frame disposed on the upper face of the substrate surrounding the placement region, and comprising a penetration part opening;
- an input/output member disposed in the frame closing the penetration part, comprising a plurality of wiring conductors which extend inward and outward of the frame and are electrically connected to the electronic component,
- and comprising via conductors which are connected to the wiring conductors and embedded at sites overlapping with the wiring conductors at an end portion of a region surrounded by the frame in the input/output member, and a ground layer disposed in a surrounding of lower ends of the via conductors being spaced from the via conductors; and
- a metal layer connected to the via conductor, surrounded by the ground layer, and disposed at the lower end of each of the via conductors.

2. The electronic component containing package according to claim 1, wherein
   intervals between the plurality of wiring conductors are narrower in the region surrounded by the frame than those outside of the frame.

3. The electronic component containing package according to claim 1, wherein
   end portions of the wiring conductors located within the region surrounded by the frame are employed as bonding wire connection positions, and the via conductors are connected to sites adjacent to the bonding wire connection positions, respectively.

4. The electronic component containing package according to claim 3, wherein
   the via conductors are connected to sites on a side of the frame adjacent to the bonding wire connection position.

5. An electronic device, comprising:
   the electronic component containing package according to claim 1;
   an electronic component disposed on the placement region of the electronic component containing package and electrically connected through bonding wires to the wiring conductors; and
   a lid connected to an upper face of the frame and sealing the electronic component.

* * * * *